Nov. 29, 1955 A. E. HYLAS 2,725,536

ELECTRICAL TUNING DEVICES

Filed Sept. 26, 1951

INVENTOR.
ALBERT EDWIN HYLAS
BY Darby & Darby
ATTORNEYS

United States Patent Office 2,725,536

Patented Nov. 29, 1955

2,725,536

ELECTRICAL TUNING DEVICES

Albert Edwin Hylas, Clifton, N. J., assignor to Allen B. Du Mont Laboratories, Inc., Clifton, N. J., a corporation of Delaware Application September 26, 1951, Serial No. 248,323

3 Claims. (Cl. 333—82)

This invention relates to electrical tuning devices and particularly to tuning devices which are suitable for use in the very high frequency radio bands.

Inductive tuning of high frequency circuits has certain well known advantages over capacitive tuning, one of the most important of which is constant impedance and band-widths of the tuned circuit throughout the tuning range. However, inductance tuning devices frequently have the disadvantage of sliding contacts, which frequently generate electrical noise in the contact area.

It is one object of this invention to provide an improved electrical tuning device.

Other objects are to improve an inductive tuning device, to provide a high frequency electrical tuning device without sliding contacts, to provide an inductive tuning device in which the tuning frequency may be made directly proportional to the angular rotation and to provide a high frequency tuning device which may be easily coupled to other electrical circuits and tracked with similar tuning devices in receivers, transmitters, test instruments, and the like.

Further objects will be apparent after studying the following specification and drawings in which.

The invention comprises a tuning device essentially consisting of an infinite number of lecher wires arranged about a rotatable shaft with the outer ends of said wires on a circle centered about said shaft and with the inner ends of said wires all short-circuited. In actual practice, the wires are replaced by two parallel sheets of conductive material with the outer peripheries of said plates describing a circle and the short-circuit for the inner ends forming a conductive strip.

Figure 1:
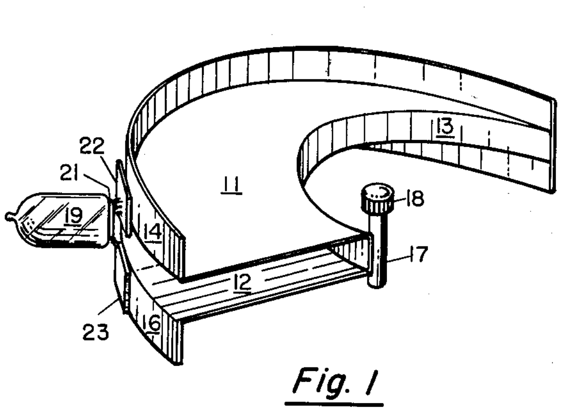
Fig. 1 is a perspective view of the tuning device constructed in accordance with the invention.

Referring now to the perspective view in Fig. 1, the side plates are indicated by the reference characters 11 and 12 and the conductive strip by character 13. In this case the strip 13 is crescent shaped, which is the preferred form, but the invention is not limited to this configuration and another form is shown and will be described hereinafter in connection with Fig. 6. A pair of cylindrically shaped flanges 14 and 16 are electrically connected to the circular outer peripheries of plates 11 and 12 respectively. A rotatable shaft 17 having a knob 18 on one end thereof is secured to the plates 11 and 12 respectively. A rotatable shaft 17 having a knob 18 on one end thereof is secured to the plates 11 and 12 in such a position that the axis of the shaft coincides with the axes of the circular outer peripheries of the plates and of the flanges 14 and 16.

Mounted adjacent to flanges 14 and 16 by any convenient means (not shown) is a vacuum tube 19 in a socket 21. The electrodes in the vacuum tube are electrically coupled to the tuning device by the plates 22 and 23, which may be in slidable contact with the flanges 14 and 16 respectively but are preferably spaced therefrom so that the tube 19 is capacitively coupled to the tuning device in order to obviate the electrical noise disturbances generated by sliding contacts.

Figure 2:
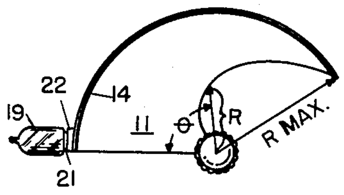
Fig. 2 is a plan view of the device in Fig. 1.

In the plan view of Fig. 2, the tuning device is shown rotated fully clock-wise with respect to the tube 19; any further clockwise rotation would remove the tube 19 from the influence of the tuning device. In this position there is a maximum length of the inductive loop, represented by the edges of the plates 11 and 12 and the short-circuited strip 13, coupled to the tube 19, and hence the operating frequency will be the lowest of which the circuit is capable.

When the tuning device is rotated counter clockwise by the knob 18 to bring the other end of the flanges 14 and 16 into juxtaposition with the capacitor plates 22 and 23, the inductive loop will have the shortest length and the circuit will be tuned to the highest frequency of which it is capable; i. e., the frequency determined by residual capacitance and inductance.

Under such conditions, the tuning device will radiate electrical energy particularly when it is tuned to the highest frequency possible. Therefore, it is desirable to provide an electrical shield for the entire unit.

Figure 3:
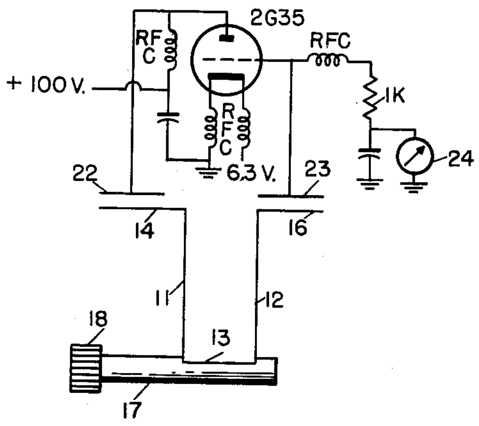
Fig. 3 is a circuit diagram of an oscillator utilizing the device in Fig. 1.

The circuit in Fig. 3 represents one form of oscillator which is particularly adapted to be used with the tuning device in Figs. 1 and 2 and the same reference characters are again used to denote similar parts of the device. The open loop comprising the plates 11 and 12 and the end short-circuited strip 13 forms the adjustable inductive tuning element of the oscillator circuit. This tuning element is capacitively coupled to the anode of the 2C35 oscillator tube by the plate 22 and is similarly capacitively coupled to the grid of the 2C35 oscillator tube by means of the plate 23. Suitable operating voltages are shunt-fed to the oscillator tube through the small radio frequency chokes indicated by the abbreviation R.F.C. and the usual grid current indicating meter 24 is provided to indicate the power generated by the oscillator. The circuit itself is well known, and is used here only as a setting for the invention. Such an oscillator may be used in receivers, transmitters, test instruments, and the like.

Figure 4:
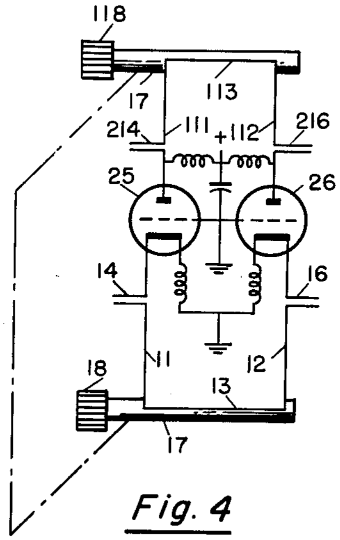
Fig. 4 is a circuit diagram of an amplifier utilizing the device in Fig. 1.

Another standard circuit is shown in Fig. 4 in which two vacuum tubes 25 and 26 are connected in a push-pull circuit with the anodes thereof being tuned by one tuning device and the cathodes thereof by a similar device mechanically interlocked with the plate tuning device to track therewith. Again the circuit is that of a standard shunt-fed push-pull amplifier, showing the invention being operated in a combination circuit requiring two identical tuning devices to be operated together as a unit. This same type of operation occurs in receivers where one tuning device may tune the input circuit, a second tuning device, the oscillator circuit; and a third tuning device, the mixer circuit.

In circuits requiring the operations of more than one tuning device and in which the tuning devices must be tracked to operate together, as in receiver circuits, there are two types of tracking problems. The simpler of the two occurs when both circuits are to be tuned to the same frequency and both circuits are substantially alike so that it is merely a matter of mechanically coupling two identical tuning devices. This type is illustrated in Fig. 4.

Figure 5:
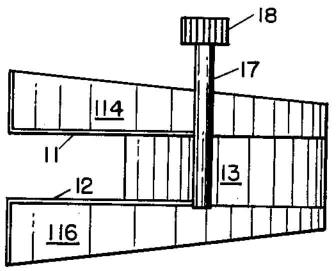

The more difficult arrangement occurs in receivers in which the oscillator must be tuned to one frequency and the mixer circuit to a different frequency and the difference between these two frequencies must be maintained constant throughout the tuning range of both. In low frequency receivers which are tuned by capacitors, it is common to introduce additional inductance and capacitance into the circuit to provide this fixed different frequency. The same effect is achieved very simply in the high frequency tuning device described herein by varying the widths of the flanges 114 and 116 as shown in Fig. 5 to vary the capacitive coupling along the lengths thereof. This same flange trimming may be resorted to in single tuned circuits where it is found that there is too great capacity at the high frequency end of the tuning device so that an oscillator circuit such as the circuit in Fig. 3 may cease to oscillate. Although in Fig. 5 the widths of flanges 114 and 116 are shown as decreasing linearly along the lengths thereof, it may be desirable in some instances to decrease the widths in some other way such as, for instance, to have a minimum width at an intermediate point and a maximum width at each end.

Figure 6:
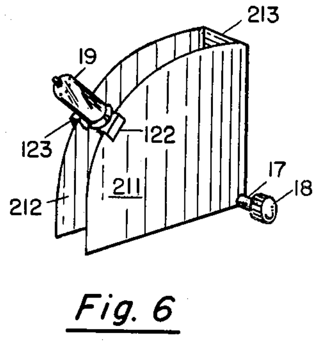
Figs. 5 and 6 are different embodiments of the invention.

The tuning device in Fig. 6 is electrically identical with the tuning device in Fig. 1 but the flanges have been omitted in this case, and instead the pick-up plates 122 and 123 are folded over adjacent the outer periphery of the plates 211 and 212. Furthermore, the short circuiting end strip 213 is straight instead of having the curved form shown in Figs. 1 and 2. The device shown in Fig. 6 is simpler to construct than as shown in Figs. 1 and 2 but results in a tuning-vs.-rotation curve which is not linear and which has a slope that increases greatly in the last few degrees of rotation as the device is rotated counter clockwise. It has been found that the shape of the short circuiting strip as shown in Fig. 2 should follow a curve constructed according to the equation $$\frac{L_{max}}{L}=\frac{R}{R_{max}}=\left(1-\frac{\theta}{90^\circ}\right)^2=\left(\frac{f}{f_{min}}\right)^2$$

where L indicates the inductance of the tuning device which obtains at any particular degree of rotation; $L_{max}$ indicates the maximum inductance which obtains at full clockwise rotation; R indicates the radial distance from the center of the shaft 17 to the point on the short circuiting strip 13 for any angle, $\theta$; $R_{max}$ indicates the maximum radius and is equal to the radius of the flanges 14 and 16 and the outer periphery of the plates 11 and 12; $\theta$ indicates the angle of rotation, starting with the horizontal edge of the plate 11 in the position shown in Fig. 2 and increasing clockwise; $f$ is the frequency to which the device is tuned; and $f_{min}$ is the minimum frequency to which the device may be tuned. The maximum inductance of the device shown in Fig. 6 is obtained by the equation $$\text{Log}_{10}\, L/_{\mu h}\ \text{max}=0.22+0.433\ R+0.2865d$$

where R and $d$ are in inches, and R is the radius to the outer perimeter and $d$ is the separation between plates 11 and 12.

In addition to the forms shown and described herein, modifications may be made in the invention without departing from the scope thereof as encompassed by the following claims.

What is claimed is:

1. An electrical tuning device comprising a channel member having conductive side walls and a conductive strip joining edges of said walls forming said channel and forming a section of the periphery thereof; a shaft rigidly secured to said member with the axis of said shaft being substantially perpendicular to said side walls, other edges of the periphery of said walls forming said channel having substantially circular shape coaxial with the axis of said shaft; a third section of said periphery being a straight line extending radially from the axis of said shaft; flanges extending substantially perpendicularly outward from each of said side walls along the circular portion of the periphery thereof, said flanges being sections of cylinders substantially coaxial with said shaft; and an electrical pickup member electrically coupled to said flanges, the radial distance between said conductive strip and said flanges varying according to the relation $$R=R_{max}\left(1-\frac{\theta}{90^\circ}\right)^2$$

where $R_{max}$ is the radius of said flanges, and $\theta$ is the annular measure starting with the third section as the reference line.

2. The device of claim 1 in which the width of said flanges varies in a predetermined manner along the length thereof.

3. An electrical tuning device comprising a channel member having conductive side walls and a conductive strip joining said walls along one boundary thereof; a shaft rigidly secured to said member with the axis of said shaft being substantially perpendicular to said walls, a second boundary of said walls having a circular shape and being coaxial with the axis of said shaft; a third boundary for said plates, said third boundary being substantially straight and extending radially from said second boundary to the common center of said shaft and said second boundary, the radial distance between said second boundary and said first boundary varying according to the relation $$R=R_{max}\left(1-\frac{\theta}{90^\circ}\right)^2$$

where $R_{max}$ is the radius of said second boundary and $\theta$ is the angular measure starting with said third boundary as the reference line.

References Cited in the file of this patent

UNITED STATES PATENTS

| | | |
|---|---|---|
| 237,608 | Sawyer | Feb. 8, 1881 |
| 1,768,394 | Bracke | June 24, 1930 |
| 2,246,928 | Schick | June 24, 1941 |
| 2,370,423 | Roberts | Feb. 27, 1945 |
| 2,627,579 | Wasmansdorff | Feb. 3, 1953 |
| 2,631,241 | Schmidt | Mar. 10, 1953 |

FOREIGN PATENTS

| | | |
|---|---|---|
| 125,295 | Sweden | June 28, 1949 |